United States Patent [19]

Calcote

[11] Patent Number: 5,104,634
[45] Date of Patent: Apr. 14, 1992

[54] PROCESS FOR FORMING DIAMOND COATING USING A SILENT DISCHARGE PLASMA JET PROCESS

[75] Inventor: Hartwell F. Calcote, Princeton, N.J.

[73] Assignee: Hercules Incorporated, Wilmington, Del.

[21] Appl. No.: 340,995

[22] Filed: Apr. 20, 1989

[51] Int. Cl.[5] ............................................. C01B 31/06
[52] U.S. Cl. .................................. 423/446; 427/38; 427/39; 156/DIG. 68; 204/192.15
[58] Field of Search .................. 423/446; 501/186; 427/38, 39; 204/190.15; 156/DIG. 68

[56] References Cited

U.S. PATENT DOCUMENTS

| | | | |
|---|---|---|---|
| 3,005,762 | 10/1961 | Fenn | 204/164 |
| 3,630,679 | 12/1971 | Angus | 423/446 |
| 3,705,937 | 12/1972 | Dzevitsky et al. | 423/446 |
| 3,961,103 | 6/1976 | Aisenberg | 423/446 |
| 4,645,977 | 2/1987 | Kurokawa et al. | 315/111.21 |
| 4,767,608 | 8/1988 | Matsumoto et al. | 423/446 |
| 4,816,286 | 3/1989 | Hirose | 427/39 |
| 4,822,466 | 4/1989 | Rabalais et al. | 204/192.15 |
| 4,851,254 | 7/1989 | Yamamoto et al. | 427/37 |
| 4,859,493 | 8/1989 | Lemelson | 427/242 |

FOREIGN PATENT DOCUMENTS

| | | | |
|---|---|---|---|
| 0286309 | of 0000 | European Pat. Off. | 423/446 |
| 35092 | 2/1984 | Japan . | |
| 232991 | 12/1984 | Japan . | |
| 60-103098 | 6/1985 | Japan | 501/86 |
| 60-122796 | 7/1985 | Japan | 501/86 |
| 60-145995 | 8/1985 | Japan | 501/86 |
| 191097 | 9/1985 | Japan . | |
| 61-286299 | 12/1986 | Japan | 423/446 |
| 62-138394 | 6/1987 | Japan | 423/446 |
| 107899 | 5/1988 | Japan . | |
| 63-182296 | 7/1988 | Japan | 423/446 |
| 282200 | 9/1988 | Japan . | |

Primary Examiner—Robert Kunemund
Attorney, Agent, or Firm—Mark Goldberg

[57] ABSTRACT

A novel process is disclosed for forming diamond coatings whereby a silent discharge, such as a DC glow discharge, is used to form a plasma containing activated species. The plasma is then expanded through a nozzle to form a low temperature plasma jet which contacts a substrate to form the diamond coating. The plasma initially contains a mixture of hydrogen and carbon based gases such as methane. In a preferred embodiment, hydrogen is initially present in the plasma and the carbon containing gas (carbon containing molecules e.g. methane, carbon monoxide) is subsequently mixed into the plasma jet downstream of the nozzle throat and allowed to react with the activated hydrogen, prior to the plasma jet contacting the substrate.

24 Claims, 3 Drawing Sheets

PROCESS FOR FORMING DIAMOND COATING USING A SILENT DISCHARGE PLASMA JET PROCESS

BACKGROUND OF THE INVENTION

This invention relates to the chemical arts. In particular, this invention relates to an improved method for preparing diamond coatings.

DESCRIPTION OF THE PRIOR ART

The mechanical, thermal, electrical and optical properties of diamond films offer major advantages in a number of areas ranging from hard surfaces to semiconductors. For example, a diamond-coated carving knife would stay sharp. The heads of computer hard disk drives which occasionally come too close to the surface of the disk, with catastrophic results, could be protected by a diamond coating only 0.03 $\mu$m thick.

Two properties of diamond make diamond coatings especially attractive to semiconductor technology: its high thermal conductivity (at room temperature the thermal conductivity of diamond exceeds that of any other material), and its electrical insulating properties. Diamond is unique in that no other material is simultaneously such a good heat conductor and a good electrical insulator. Diamond coatings thus offer the possibility of more densely packed microchips (i.e., more transistors per chip) with an attendant increase in computer power. Diamond coating offer the possibility of replacing silicon semiconductors, since they can be doped to form p- and n-type materials. Diamond has a large electron band gap compared to silicon. This larger band gap makes diamond less sensitive to thermal or radiation damage than silicon, so diamond transistors could be used in hostile environments. Another characteristic of diamond which makes it attractive as a semiconductor is that the high velocity of electron transmission through it increases smoothly with increasing electric field, unlike many types of semiconductors. The electron velocity in diamond can be even greater than in gallium arsenide, the current champion in high speed semiconductors. This high electron velocity, coupled with diamond's ability to sustain a greater electric field than other semiconductors before breakdown, makes it a candidate material for high power telecommunication systems.

The optical properties of diamond also offer exciting possibilities. Pure diamond is transparent to photons from the far IR (80 $\mu$m) to the UV (230 nm), so diamond coatings have potential for many window applications.

The preparation of diamond coatings using plasma chemical vapor deposition (CVD) has been reported in the prior art. Plasma CVD involves forming a plasma containing activated species using a direct current (dc), low frequency, or radio frequency (rf) or microwave discharge and then contacting a substrate with the plasma to form a diamond coating.

Electrical discharges such as glows, coronas, arcs, radio frequency and microwave have been studied for many years as tools for forming plasmas containing activated species. Such discharges can generally be divided into low temperature and high temperature systems. Low temperature systems, include glows, coronas, electrodeless discharges, and the so-called ozonator type discharges, as well as some RF and microwave discharges, and are collectively known as silent discharge systems. Chemical activation in low temperature systems results in a non-equilibrium product of activated species such as ions and free radicals. The concentration of active species in such plasmas is much greater than would be expected on the basis of equilibrium, i.e. thermal considerations.

In contrast, in high temperature discharges, such as an electrical arc, the concentration of activated species depends upon attaining a thermodynamic equilibrium favoring the activated product. This means that the process of producting active species is inefficient, most of the heat being used to heat the gas. In order to produce a significant amount of activated species, extremely high temperatures, e.g. temperatures of at least 4000° K. are required. Temperatures as high as 10,000° to 30,000° K. are not uncommon in arcs. The use of such high temperatures in preparing diamond films presents difficulties. Not only does it require a great amount of power, but it results in heating the substrate to the extent that graphite and amorphous carbon may be formed instead of diamond and even in the destruction of the substrate. It also limits the types of substrates that can be used due to problems with the thermal stability of the substrate and differences between the coefficients of expansion of the substrate and the deposited diamond film.

The preparation of diamond films by high temperature plasma CVD is described in Kurihara et al., Appl Phys. Lett., 52(6) 19:pp 437 and 438 (1988) and in European Patent Application 0286306, filed Mar. 30, 1988. In one embodiment a plasma is formed by passing a mixture of methane and hydrogen through an arc discharge. The arc discharge produces activated species in a thermal plasma. The plasma is then passed through a nozzle, expanded to precipitate diamond and then directed onto a substrate. Kurihara et al. suggest that the problem of forming graphite or amorphous carbon on the substrate because of the high temperatures can be overcome by water cooling the substrate.

Method for preparing diamond films using non-equilibrium plasma CVD have been described, but not with subsequent expansion of such plasmas through a nozzle so as to form a high-velocity plasma jet.

Another recent description of the preparation of carbon films by high temperature plasma CVD is found in U.S. Pat. No. 4,767,608 (Matsumoto et al.). That patent discloses the formation of diamond using an electric arc discharge which utilizes high temperatures to produce significant amounts of activated species. Although the use of a low temperature plasma produced by glow discharge is suggested in this patent, Matsumoto et al. actually teach away from the low temperature method by noting that it results in a very slow rate of diamond growth.

The use of a non-equilibrium plasma jet is described in a report entitled "Synthesis of Silane and Silicon in a Non-equilibrium Plasma Jet", authored by H. F. Calcote (Department of Energy/Jet Propulsion Laboratory Report 954560-76/8) which discloses the preparation of amorphous and polycrystalline silicon films which are strongly adhered to Pyrex, Vycor, aluminum or carbon. The plasma was formed using a DC discharge and subsequently expanded through a nozzle to form a plasma jet which was directed upon a substrate. This non-equilibrium plasma jet provided the source of hydrogen atoms via the dissociation of hydrogen gas in an electrical discharge to react with silicon halides.

A different approach to forming diamond coatings is used in the invention described herein. A gas or a mixture of gases is passed through a low temperature silent discharge and expanded through a nozzle to produce a high velocity plasma gas stream of highly ionized and dissociated gases at a relatively low temperature (250° to 1400° K.). The degree of ionization and dissociation is very far out of equilibrium; in fact, to obtain the same degree of ionization and dissociation thermodynamically, the gas would have to be heated to several thousand degrees Kelvin.

The advantages for this process, in accordance with the invention, over conventional low temperature discharge systems and arc jet systems, may be summarized as follows:

(i) Energy is efficiently utilized. It is not wasted in heating the gas to a high temperature as in an arc jet.

(ii) The actual reactant temperature can be very low, which frequently minimizes the occurrence of unwanted side reactions.

(iii) Only one of the reactants need be exposed to the discharge. This minimizes byproducts due to activation of the second reactant and avoids destruction of the desired intermediate products (ions and free radicals) by not exposing them to the discharge, as in conventional low temperature discharge systems.

(iv) A very high velocity stream of highly reactive species is produced.

(v) The low temperatures greatly minimize the materials problems encountered with the use of arc jets.

(vi) The lower temperature not only mitigates problems of the formation of graphite or amorphous carbon, but also mitigates problems involving substrate properties such as thermal stability and coefficients of expansion matching that of the deposited films. This means that the invention makes it possible to coat substrates which could not be coated using conventional techniques.

(vii) Large throughputs are possible compared to the conventional low temperature discharge systems and the rate at which the reactants strike the substrate surface is much greater than in conventional low temperature systems. This also means that the rate of deposition on a substrate is greater than with conventional low temperature systems.

(viii) Fouling of the electrode by carbonaceous deposits is eliminated by downstream injection of the carbon-containing species.

SUMMARY OF THE INVENTION

A substrate is given a diamond coating by first generating a low temperature non-equilibrium plasma gas stream containing activated species through exposure of a first reactant gas moving at a relatively low velocity to a silent electrical discharge. The activated species is then expanded through a nozzle to form a low temperatue plasma jet which contacts the substrate at high velocity to form a diamond coating. The plasma produced by the discharge may initially contain a mixture of hydrogen and carbon containing gasses. In a preferred embodiment, hydrogen is initially present when the plasma is formed by the silent discharge and the carbon containing gas is subsequently added downstream of the throat of the nozzle.

DETAILED DESCRIPTION OF THE PREFERRED EMBODIMENTS

Figure 1:
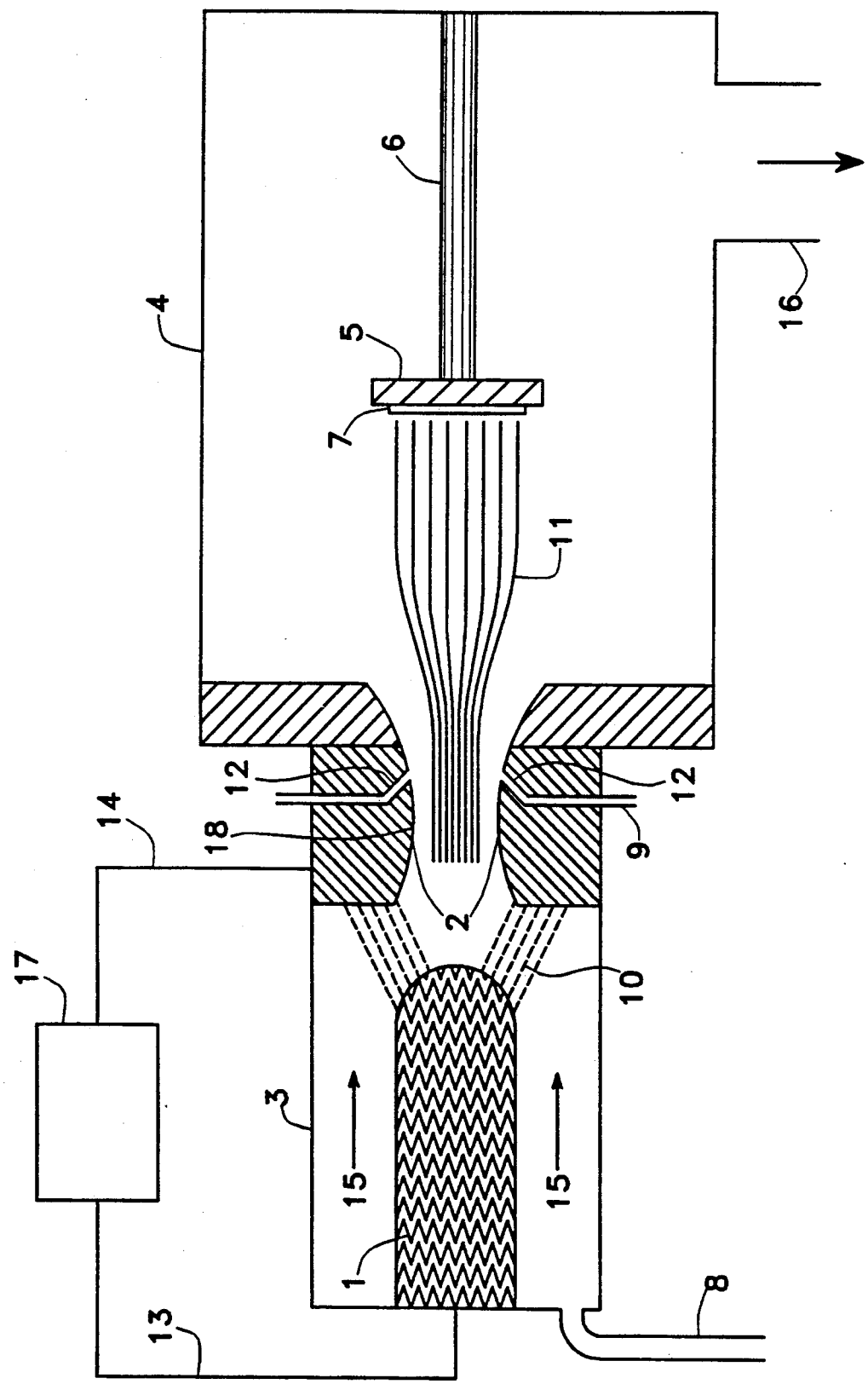
FIG. 1 shows diagrammatically the basic apparatus for carrying out the process of the invention when a dc glow discharge is used to activate the gas.

An apparatus for producing a non-equilibrium plasma jet is disclosed in U.S. Pat. No. 3,005,762, which is incorporated by reference herein.

When relatively low voltages up to a few hundred volts are impressed on a pair of electrodes, a small current, on the order of microamperes, is produced. As the voltage between the two electrodes increases, the current also increases slowly until at a critical potential difference, depending upon the electrode distance, the chemical nature of the gas, and the pressure and temperature of the gas, but usually of a magnitude in the thousands of volts, a sharp increase in current occurs to a value on the order of milliamperes or even amperes. The increase in current flow is attributable to an increase in the number of ions and electrons in the gas. If the applied voltage is increased still further, the number of ions continually increases, causing an increase in current flow, but with very little change in voltage. The region of increasing current with no change in voltage is the region of a glow discharge. Eventually, a point is reached with increasing current at which there occurs a sudden increase in current flow to the order of many amperes. Simultaneously, the potential difference between the two electrodes drops to a few volts and there occurs what is known as a high-current arc. The arc is maintained by copious emission of electrons from the cathode. Thus in arc devices the cathode is sputtered and has to be periodically replaced. A further problem is that the sputtered material becomes a part of the plasma and a potential contaminant for any deposition made by the plasma.

This invention relates to that part of the current voltage curve between onset of a glow discharge and the occurrence of a high current arc.

The electrical descharge phenomena discribed can be brought about with either alternating or direct electric current. When alternating current of sufficient frequency is employed, the electrodes do not need to be in contact with the discharged gas and may be separated from the discharge by a dielectric material such as a quartz or PYREX tube. In such cases, the current flow in the gas occurs by induction and the resulting discharge is frequently termed an electrodeless discharge.

The present invention relates only to the type of discharge occurring prior to onset of an arc, i.e., the type of discharge wherein the current densities are on the order of milliamperes to amperes per square centimeter, and where the voltages involved are of a relatively high magnitude. Such discharges include those commonly known as corona, glow, electrodeless, and ozonizer discharges and are frequently referred to generically as "silent electric discharges". RF and microwave discharges, operated at low currents and high voltages, i.e. prior to arc breakdown, are included in this class. Thus, in the specification and claims following hereinafter, the term "discharge" shall mean a discharge of the silent type characterized by a relatively high voltage, a relatively low current density, and a relatively low gas temperature, as contrasted to the low voltage, high current, and high temperature of the arc discharge.

The term "plasma" shall refer to gas which has been activated or excited by the discharge. Such gas is usually characterized by luminosity and usually contains substantial quantities of dissociated species such as free radicals, atoms, irons, and electrons. The term plasma as used herein will be used to indicate gas in any state of excitation or activation resulting from exposure to a discharge of the the silent type.

In the present invention, means are provided for introducing a gas into a chamber at relatively low velocity where it is subjected to a silent discharge. A high temperature arc discharge can be used in this invention. However, it is preferred to employ a low temperature silent discharge in which non-equilibrium concentrations of activated species are produced by the discharge. Here, energy utilization in the plasma is more efficient and deposition can be performed with lower substrate temperatures.

In accordance with the invention, means are provided for expansion of the plasma through a nozzle into an expansion chamber, in which the pressure is substantially less than that in the discharge chamber, providing a jet of a highly reactive non-equilbrium gas moving at a high velocity. In general, mixtures of hydrogen and the carbon containing gases may be introduced into the discharge chamber and subjected to the silent discharge. In alternate embodiments, means are provided for introduction of the carbon containing gas in the expansion section of the nozzle downstream of the throat, or into the jet after it leaves the nozzle. Such an arrangement enables production of non-equilibrium plasma jets by a silent discharge whereby both the carbon forming gas and the products which are formed when it reacts with the activated hydrogen are not exposed to the discharge.

Reference is made to FIG. 1, a schematic diagram of the basic arrangement of the apparatus for practicing the present invention. The hydrogen gas, or a mixture of hydrogen and a carbon containing gas, is introduced through a reactant input duct 8 into the discharge chamber 3. The hydrogen gas and carbon containing gas flow 15 passes through the discharge chamber 3, through an electrical discharge 10, and through the nozzle 2, to form a supersonic, or high velocity jet 11 which strikes the substrate 7. The electrical discharge which converts the gas passing through it into a plasma is produced by the application of an electrical potential from power supply 17, through electrical feed lines 13 and 14 across the gap between the electrode 1, and the nozzle 2 which acts as the other discharge electrode. The power supply 17 may be produce an alternating or direct current. The metal of the electrodes can be of various kinds but should be of high thermal conductivity. At high-current densities, or when metals of lower melting points, such as copper or aluminum, are employed, it may be necessary to cool the electrodes by circulation of a fliud such as water through channels in the electrodes, not shown. In cases where the coolant is electrically conductive, a sufficiently long path through non-conductive tubing must be provided for the coolant to any non-grounded electrode, 1 or 2, in order to minimize the leakage of electric current through the coolant to the ground. The optimum chamber pressure depends upon a number of factors such as electrode distance and shape, power supply voltage, the nature of the gas, and the frequency of the current when an alternating current is employed. At low frequencies or with direct current, it is usually desirable to have the discharge chamber 3 at a pressure from about 10 to about 760 torr, preferably from about 30 to about 400 torr. The effective temperature (from statistical mechanics considerations, a non-equilibrium plasma does not have a temperature in the correct use of the term) of the plasma produced by the silent discharge is typically in the range of 500° to 2000° K., preferably from about 1300° to about 1800° K.

The nozzle 2 provides a means of expanding the plasma from the discharge chamber 3 into the expansion or deposition chamber 4. The plasma flows through the nozzle 2 and is accelerated because of the pressure drop between chamber 3 and chamber 4 into the expansion chamber 4 at a high velocity and at a reduced temperature. The temperature of the expanded plasma jet as it passes into chamber 4 can be estimated from the pressure ratio:

$$T_{EC} = \left(\frac{P_E}{P_{DC}}\right)^2 T_{DC}$$

where $T_{DC}$ is the gas dynamic temperature in the discharge chamber, $T_{EC}$ is the temperature of the jet in the deposition chamber or expansion chamber, $P_{DC}$ and $P_{EC}$ are the pressure in the discharge chamber and the expansion chamber, respectively. The temperature in the discharge chamber is estimated from the pressure increase when the discharge is turned on. The pressure in the expansion chamber 4 is always maintained at a value less than that in the discharge chamber 3. The pressure in the expansion chamber is generally from about 1 to about 100 torr, preferably from about 5 to about 50 torr. In this embodiment a vacuum pump, not shown, is connected to the expansion chamber 4 through an exhaust duct 16 containing a suitable throttling means, also not shown, for the regulation of pressure within the expansion chamber 4.

The area of the throat of the nozzle 2 is principally determined by the velocity which is desired in the jet striking the substrate and the mass rate of flow of gas desired. They are determined by the dimensions of the substrate to be treated and its orientation to the stream. These factors can be varied over wide ranges.

If high enough pressure ratios are employed, the jet velocities may reach serveral times the local speed of sound in the gas. Thus, velocities on the order of thousands of feet per second may be obtained, depending upon the molecular weight and specific heat ratios of the gas, its initial temperature prior to expansion, and the pressure ratio existing between the two chambers. Employment of a nozzle constructed so as to impart sonic, or supersonic, velocities to the reactive gas affords certain advantages. The greater the velocity, the greater the rate of deposition and the less time available for the concentration of reactants to decay. After expansion, the plasma jet will typically have a temperature in the range of from about 250° K. to about 1800° K.

In the embodiment illustrated, means are provided for introducing the carbon containing gas, in the nozzle exit section downstream of the nozzle throat 18, the smallest diameter of the nozzle, through a secondary reactant input duct 9 connected to a plurality of orifices 12 through which the carbon containing gas is injected to a rapidly mix with the plasma 10 produced by the discharge to form the plasma jet 11. The velocity of gas injection is mainly determined by the pressure drop across orifice 12.

The plasma jet 11 is directed so that it contacts a substrate 7. The substrate is positioned in the expansion chamber 4 using a substrate holder 5, mounted on a positioning rod 6 that allows translation of the substrate towards or away from the nozzle 2. The substrate will generally be located from about 2 to 30 cm, preferably from about 6 to 10 cm from the nozzle.

The relatively high temperature of the plasma and the great velocity of the plasma jet when it impinges on the substrate will heat the substrate to temperatures very close to the temperatures in the discharge chamber 3. This occurs because the random energy which defines temperature has been converted to directed energy, high gas velocity, in the downstream section of the nozzle, simultaneous with a decrease in gas temperature. When this jet strikes the substrate, the gas jet is suddenly stopped and the directed energy returned to random energy through a shock wave which is produced in front of the substrate. Energy is conserved. Consequently, under some conditions of operation, it may be necessary to cool the substrate, so that the substrate holder may be provided with cooling means, not shown. Alternatively, under other conditions of operation, it may be desirable to supply additional heat to the substrate, so that the substrate holder may be provided with means for heating the substrate, not shown. The substrate is usually maintained at a temperature between 300° and 1100° K.

Typically, the substrate will be oriented substantially perpendicular to the flow of the plasma jet. This will tend to maximize the rate of deposition of the diamond coating. However, the substrate holder may be provided with means for pivoting the substrate so that the area which is contacted may be increased.

Figure 2:
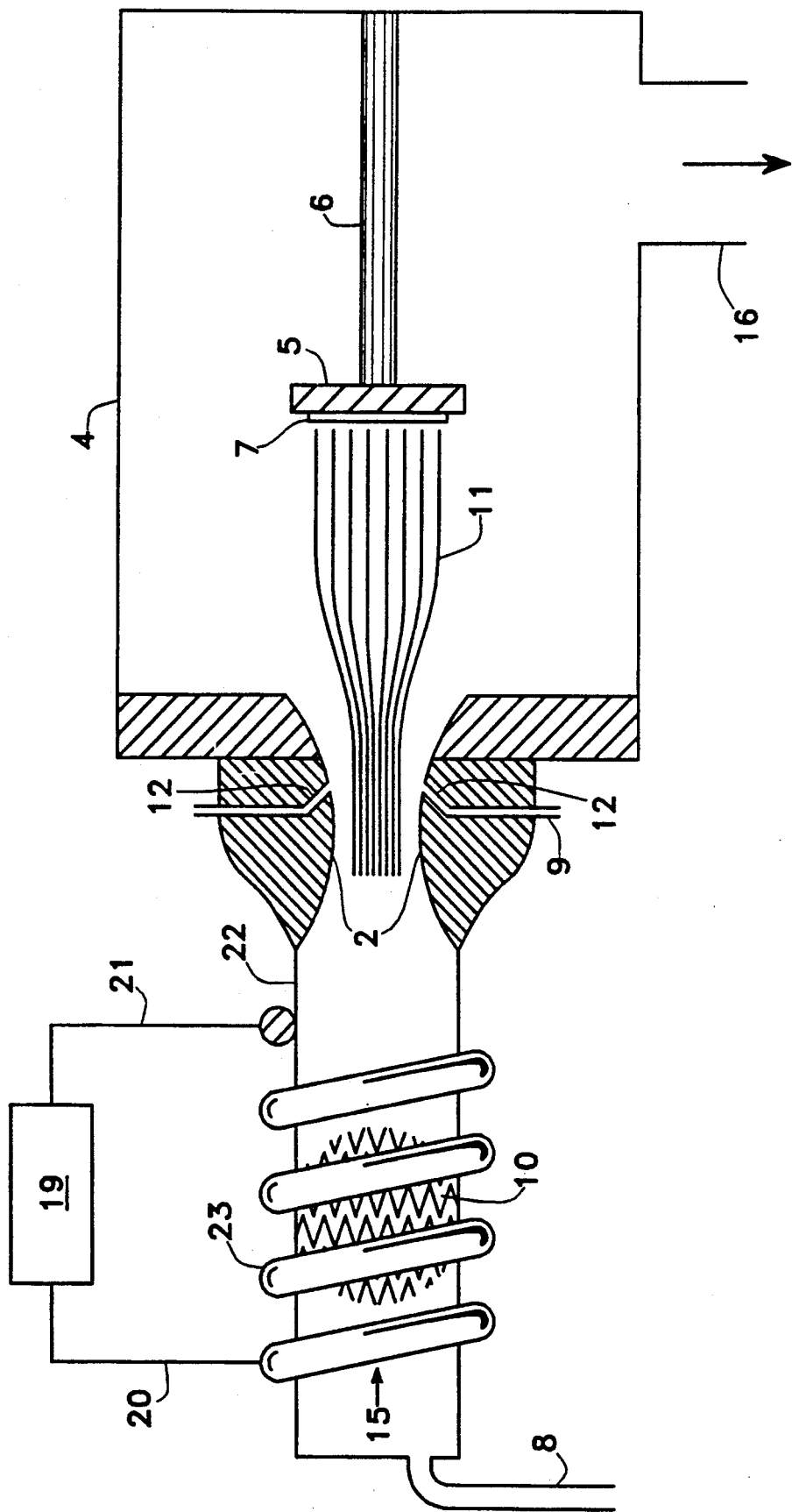
FIG. 2 shows diagrammatically an embodiment of the apparatus for carrying out the process of the invention, when a radio frequency (rf) discharge is used to activate the gas.

Reference is made to FIG. 2, which shows an embodiment employing a radio frequency (rf) electrical discharge to activate the gas, instead of the dc discharge described above. Power supply 17 of FIG. 1 is replaced by a radio frequency power supply 19 and the electrical leads 13 and 14 are replaced by electrical leads 20 and 21 which may now be coaxial cables to reduce electrical losses when higher rf frequencies are employed. Discharge chamber 3 of FIG. 1 is replaced by discharge chamber 22 made of a nonconducting substance, e.g. quartz or PYREX and is surrounded by an rf coil 23. The dimensions and number of turns in coil 23 depend upon the frequency and impedance requirements of the rf power supply 19. This will be readily determined by one skilled in the art. At higher power levels it will be necessary to cool coil 23, by passing a cooling fluid such as water through it (not shown in the figure). When conducting fluid is used it will have to be isolated from electrical ground, e.g. by passing it through a long length of nonconducting tubing so that the length of conducting liquid used has a high electrical resistance to ground. The rf power is inductively coupled to the gas passing through the discharge chamber 22 producing an rf electrical discharge inside chamber 22. This type of discharge avoids electrodes being in contact with the gas and is thus useful when ultra pure diamonds are required as in semiconductors. All other components in FIG. 2 are the same as those identified in FIG. 1.

Figure 3:
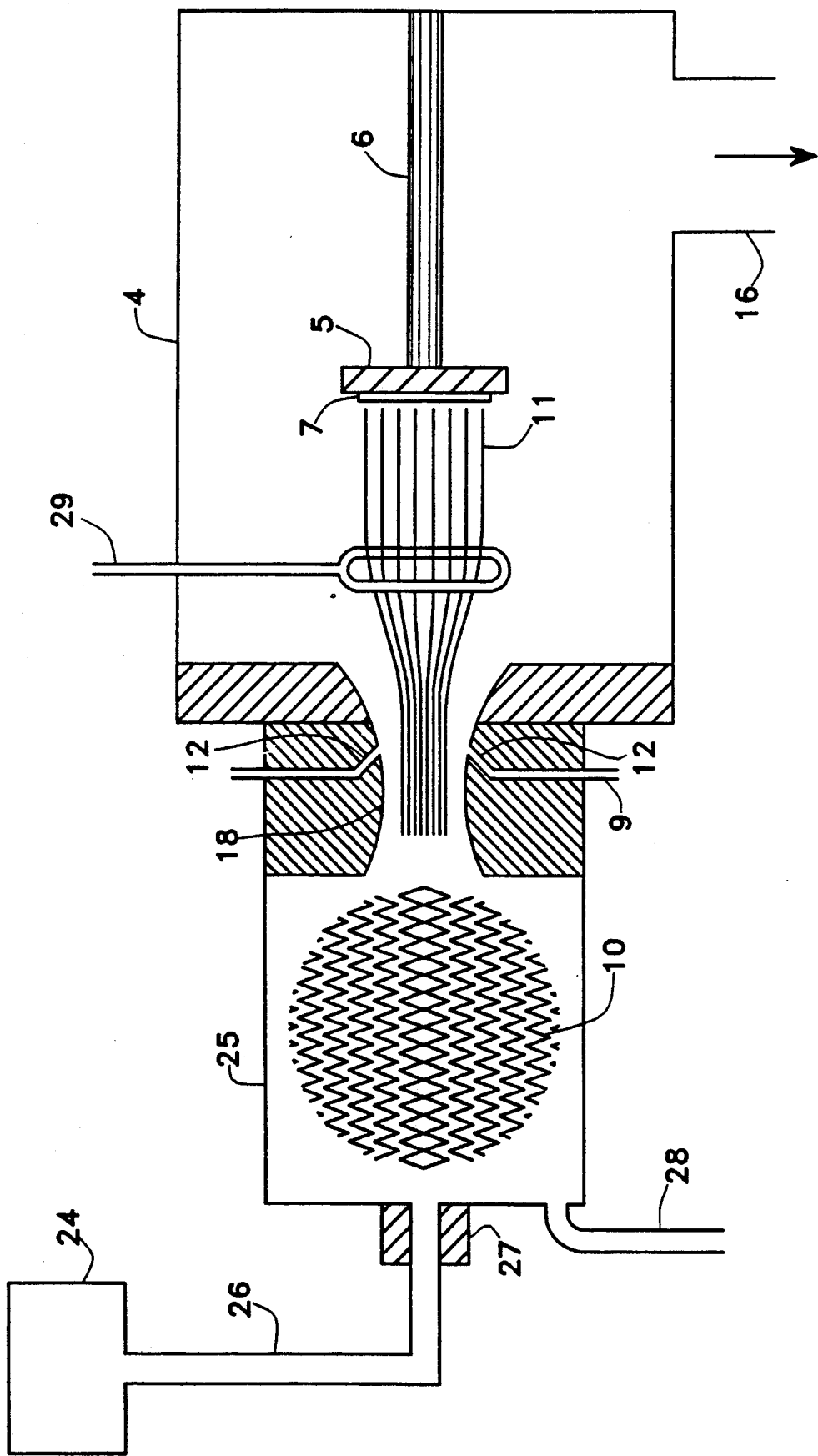
FIG. 3 shows diagrammatically an embodiment of the apparatus for carrying out the invention when a microwave discharge is used to activate the gas.

In another embodiment of the invention, as shown in FIG. 3, the electrical power which activates the gas is furnished by a microwave power supply 24 coupled to the discharge chamber 25 through an appropriate wave guide 26 and coupling device 27. The discharge chamber 25 also serves as a microwave resonant cavity so that the high electromagnetic fields created therein ionize the gas fed to chamber 25 through feed line 28 creating a plasma. Also shown is ring injector 29 which serves to direct and concentrate the carbon-containing gas so that a higher proportion of the gas contacts the substrate. Although not shown in FIGS. 1 and 2, a ring injector can be employed in the apparatus shown in those Figures for the same purpose. The ring injector 29 may also be used to inject an additional reactant gas downstream of the nozzle. This embodiment allows the substrate to be positioned further from the nozzle while retaining the ability to adjust the substrate to nozzle distance independently of the distance between the substrate and the point of downstream injection. This flexibility allows for greater control of process parameters leading to optimization of diamond growth conditions. All other components of FIG. 3 are the same as those indentified in FIG. 1.

In some embodiments of this invention, the carbon containing gas is initially mixed with the hydrogen before the gases are introduced into the discharge chamber. In preferred embodiments, the carbon containing gas is added only after the hydrogen has been activated by the silent discharge. When a carbon containing gas is put through the discharge chamber, carbon is frequently deposited on the nozzle, eventually interfering with the flow.

The amount of the carbon containing gas added or mixed with the hydrogen can be varied from about 0.1 to about 70 mol % of hydrogen depending on which gas is used. For example, for methane the concentration is preferably from about 0.5 to 3 mol % based on the hydrogen and for carbon monoxide it is preferably from about 10 to 40 mol %.

Representative carbon containing gases include hydrocarbons containing one to four carbon atoms such as methane; alcohols containing one to four carbon atoms, such as ethanol; and other oxygen containing hydrocarbons containing one to four carbon atoms such as acetone and carbon monoxide. The mixture may also contain from about 5 to about 30 mol %, preferably about 10mol %, of an inert or noble gas, such as helium. The inert gas helps to stabilize the discharge.

Representative substrates include silicon, nickel, gallium arsenide, titanium, copper, copper-carbon composite, aluminum nitride, silicon carbide, aluminum-silicon-carbon composite, alumina, molybdenum, gold, spinel, silica, tungsten, graphite, copper-tungsten alloys and silicon-iron.

Surprisingly, the process, in accordance with the invention, results in the production of diamond coatings on the substrate, instead of any of the many other forms of carbon such as graphite, amorphous carbon, hydrogenated carbon, glassy carbon or other carbon allotropes. This is confirmed by Raman spectroscopy, in the following examples, with the characteristic diamond peak seen at about 1332 cm$^{-1}$. The exact location of the peak is determined by a number of factors, e.g. the stain between the film and the substrate. The purity of the diamond deposit is indicated by the height of the scattered Raman peak width. A diamond quality factor, Q, is used herein to refer to the ratio of the peak intensity above the underlying continuum to the intensity of the underlying continuum above the minimum in the baseline in the range of 500 to 1700 cm$^{-1}$. This continuum is probably associated with graphite, which has a scattering efficiency about 100 times that of a diamond. Quality factor as high as 27 have been observed. It is to be understood, however, that as in natural diamonds, small amounts of impurities, such as hydrogen, nitrogen or silicon may be present. In some embodiments it may actually be desirable to introduce "impurities", such as when the diamond coating is doped to form p- and n-type materials.

EXAMPLE 1

The apparatus show in FIG. 1 was operated for 6 hours at an applied voltage of 1095 volts and current of 2.0 amperes, with a discharge power of 2200 W while feeding hydrogen at 23.7 mmole/s and helium at 2.37 mmole/s through feed line 8. Methane was added at 0.13 mmole/s in the nozzle through feed line 9 and orifices 12. The pressure in the plasma chamber was 127 torr and that in the deposition chamber was 17 torr. The discharge gas temperature was about 1600° K. and the expanded jet temperature was 900° K. A silicon substrate, 8 cm downstream of the nozzle, was maintained at a temperature of 1100° K. by the addition of 200 watts of electrical energy to the substrate holder 5. A diamond film having an average thickness of 1-2 μm was deposited over the entire 16 cm$^2$ exposed surface of the substrate. A Raman spectrum of the film exhibited the diamond feature at 1332 cm$^{-1}$ on an underlying continuum of comparable magnitude. X-ray diffraction analysis of the film confirmed the presence of crystalline diamond with some α-SiC at the interface. There was no indication of the presence of graphite, yet the Q was only 0.51.

EXAMPLE 2

Hydrogen, helium, and oxygen, at the respective flow rates of 23.7, 2.37, 0.024 mmole/s were fed to the discharge in FIG. 1 through feed line 8. A silicon substrate maintained at about 1000° K. was positioned at a 30° angle to the jet axis 7 cm from the nozzle. With the discharge operating at 2360 W, 1180 volts and 2 amperes, the discharge gas temperature was 1640° K. Methane was added at 0.39 mmole/s to the jet through a ring injector located 2 cm downstream of the nozzle, at the above conditions for 305 min. A diamond film having a mean thickness over a 6 cm$^2$ area of 0.6 μm was produced on the substrate. The film gave a Raman spectrum with the diamond feature near 1332 cm$^{-1}$ with a quality factor, Q=22.

EXAMPLE 3

A molybdenum substrate was maintained at a temperature of 940° K. (by heating it electrically) at a distance of 9 cm from the nozzle of the apparatus shown in FIG. 1. Hydrogen and helium gases were fed at respective flows of 23.7 and 2.37 mmole/s to the discharge through feed line 8. While operating the discharge at 2500 W and 228 torr, methane was added at 0.39 mmole/s to the downstream jet through feed line 9. This resulted in a discharge gas temperature of 1630° K. and an expanded jet temperature of 890° K. Operation at these conditions for one hour resulted in production of a 16 cm$^2$ diamond film covering the exposed surface of the substrate and having a maximum thickness of 2-3 μm. A Raman spectrum of the film exhibited the diamond feature at 1334 cm$^{-1}$.

EXAMPLE 4

In a similar experiment to that described in Example 5, a molybdenum substrate was maintained at a temperature of 1065° K. by electrical heating at a distance of 9 cm from the nozzle of the apparatus shown in FIG. 1. Hydrogen and helium gases were fed at respective flows of 23.7 and 2.37 mmole/s to the discharge through feed line 8. While operating the discharge at 2500 W and 228 torr, a mixture of 0.77 mmole/s of methane and 0.08 mmole/s of oxygen were added to the downstream jet through feed line 9. Operation at these conditions for one hour resulted in production of a 16 cm$^2$ diamond film covering the exposed surface of the substrate and having an average film thickness of 4-5 μm. A Raman spectrum of the film exhibited the diamond feature at 1338 cm$^{-1}$.

EXAMPLE 5

In a similar experiment the apparatus of FIG. 1 was used except no energy was applied to the substrate holder which was allowed to seek its own temperature, 815° K. The substrate was quartz placed 7.5 cm from the nozzle exit, hydrogen and helium were fed through the discharge at 23.7 and 2.37 mmole/s respectively, 0.39 mmole/s of methane were injected into the nozzle exit section through feed line 9, and the discharge was operated at 2180 watts at a total pressure of 139 torr. This resulted in a discharge gas temperature of 2300° K. and an expanded jet temperature of 1170° K. The pressure in the deposition chamber was 17.4 torr. A diamond film was deposited as indicated by the Raman peak with a quality factor of 2.8.

EXAMPLE 6

In another experiment using the apparatus shown in FIG. 1, a molybdenum substrate was held 9 cm from the nozzle exit, and was heated only by energy from the downstream jet expanding from an upstream pressure of 224 torr into the deposition chamber at a pressure of 17 torr. Feeding a mixture of hydrogen at 23.7 mmole/s and helium at 2.37 mmole/s through line 8 to the discharge operated at 2050 W, and feeding methane to the downstream jet at 0.39 mmole/s through line 9, resulted in a substrate temperature of 715° K. Operation in this manner for 8 hours produced a diamond film on the substrate as evidenced by a characteristic Raman feature at 1333 cm$^{-1}$ with a quality factor greater than 1.

While this invention has been described in detail, it will be appreciated by those skilled in the art that other embodiments or modifications may be made which are within the fully intended scope of this invention.

What I claim:

1. A method for preparing diamond coatings comprising:
   (a) generating a low temperature non-equilibrium plasma gas stream in a discharge chamber by exposing a first reactant gas to a silent electrical discharge;
   (b) expanding said low temperature non-equilibrium plasma gas stream into a region of lower pressure to form a plasma gas stream;

(c) rapidly admixing a second reactant gas into said plasma gas stream; and then (d) directing said admixed plasma gas stream to contact a substrate to deposit a diamond film on said substrate.

2. The method of claim 1 wherein said region of lower pressure is an expansion chamber.

3. The method of claim 1 wherein said low temperature non-equilibrium plasma gas stream is expanded through a nozzle into said region of lower pressure.

4. The method of claim 1 wherein said second reactant gas is added to said first reactant gas in an expansion section of a nozzle.

5. The method of claim 1 wherein a ring injector is positioned in said region of lower pressure to inject an additional reactant gas stream.

6. The method of claim 1 wherein said first gas is hydrogen.

7. The method of claim 1 wherein said first gas is a mixture of hydrogen and an inert a noble gas.

8. The method of claim 1 wherein said second gas consists of an carbon containing gas containing one to four carbon atoms or a mixture of said carbon containing gas with a gas selected from the group consisting of hydrogen, an inert or noble gas and mixtures thereof.

9. The method of claim 8 wherein said second gas comprises from about 5 to about 30 mol % of an inert or noble gas.

10. The method of claim 8 wherein said second gas is from 0.1 to 70 mol % of the amount of hydrogen in said first gas.

11. The method of claim 10 wherein said second gas is from 0.5 to 3 mol % of the amount of hydrogen in said first gas.

12. The method of claim 8 wherein said carbon containing gas is methane.

13. The method of claim 8 wherein said carbon containing gas is a hydrocarbon.

14. The method of claim 8 wherein said carbon containing gas further contains oxygen.

15. The method of claim 8 wherein said carbon containing gas is selected from the group consisting of ethanol, acetone and carbon monoxide.

16. The method of claim 1 wherein said low temperature non-equilibrium plasma gas stream prior to expansion is at a temperature in the range from about 500° to about 2000° K.

17. The method of claim 16 wherein said low temperature non-equilibrium plasma gas stream prior to expansion is at a temperature in the range from about 1300° to about 1800° K.

18. The method of claim 1 wherein said high velocity plasma gas stream after expansion is at a temperature between 250° and 1800° K.

19. The method of claim 1 wherein the substrate is maintained at a temperature between 300 and 1100° K.

20. The method of claim 1 wherein said substrate is selected from the group consisting of silicon, nickel, gallium arsenide, titanium, copper, copper-carbon composite, aluminum nitride, silicon carbide, aluminum-silicon-carbon composite, molybdenum, gold, spinel, silica, tungsten, alumina, silicon-iron, copper-tungsten alloys and graphite.

21. The method of claim 2 wherein said discharge chamber is at a pressure in the range from about 10 to about 760 torr.

22. The method of claim 21 wherein said discharge chamber is at a pressure in the range from about 30 to about 400 torr.

23. The method of claim 2 wherein said expansion chamber is at a pressure in the range from about 1 to about 100 torr.

24. The method of claim 23 wherein said expansion chamber is at a pressure in the range from about 5 to about 50 torr.

* * * * *